United States Patent
Taito (10) Patent No.: US 6,304,120 B1
(45) Date of Patent: *Oct. 16, 2001

(54) BUFFER CIRCUIT OPERATING WITH A SMALL THROUGH CURRENT AND POTENTIAL DETECTING CIRCUIT USING THE SAME

(75) Inventor: Yasuhiko Taito, Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/372,592

(22) Filed: Aug. 12, 1999

(30) Foreign Application Priority Data

Apr. 7, 1999 (JP) .................................... 11-099770

(51) Int. Cl.[7] ................. H03K 5/12; H03K 3/00
(52) U.S. Cl. .............................. 327/170; 327/112
(58) Field of Search ................... 327/108, 111, 327/112, 170, 389, 391, 427, 434, 437; 326/82, 83, 86, 87, 27

(56) References Cited

U.S. PATENT DOCUMENTS

| | | | |
|---|---|---|---|
| 4,749,882 | * 6/1988 | Morgan | 327/170 |
| 5,291,071 | * 3/1994 | Allen et al. | 327/108 |
| 5,311,084 | * 5/1994 | Gabara | 327/170 |
| 5,315,173 | * 5/1994 | Lee et al. | 327/170 |
| 5,568,081 | * 10/1996 | Lui et al. | 327/108 |

FOREIGN PATENT DOCUMENTS 05-335898  12/1993  (JP).

* cited by examiner

Primary Examiner—Toan Tran
(74) Attorney, Agent, or Firm—McDermott, Will & Emery (57) ABSTRACT

In a buffer circuit, a first current restricting element is connected in series with an N channel MOS transistor between an output node of a first inverter in a first stage and a line of a ground potential, and a second current restricting element is connected in series with a P channel MOS transistor between an output node of a second inverter in the first stage and a line of a power supply potential. A through current flowing in each of the first and second inverters of the first stage can be suppressed even when an input signal stays near an intermediate level.

18 Claims, 7 Drawing Sheets

BUFFER CIRCUIT OPERATING WITH A SMALL THROUGH CURRENT AND POTENTIAL DETECTING CIRCUIT USING THE SAME

BACKGROUND OF THE INVENTION

1. Field of the Invention

The present invention relates to a buffer circuit and a potential detecting circuit using the buffer circuit, and in particular relates to a buffer circuit for transmitting an input signal to a circuit in a subsequent stage as well as a potential detecting circuit for detecting whether an input potential reaches a target potential or not, and transmitting a signal depending on the result of detection to a circuit in a subsequent stage.

2. Description of the Background Art

Conventional semiconductor memory devices are provided with high-potential generating circuits for generating high potentials VPP higher than a power supply potential VCC.

Figure 6:
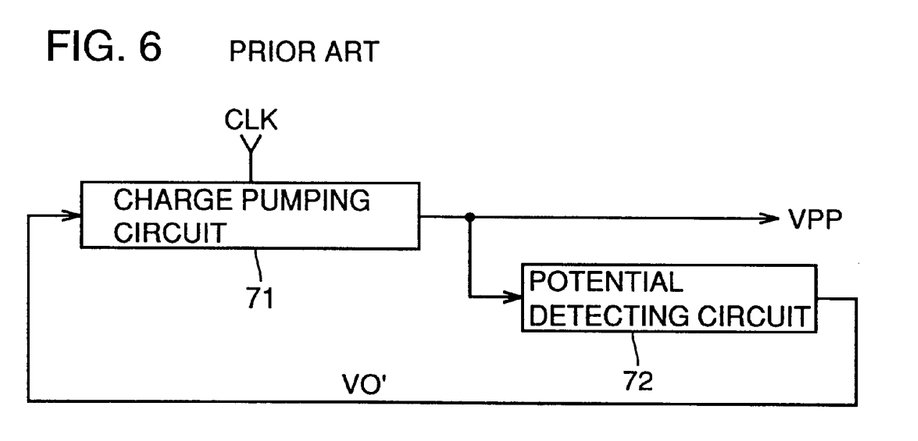
FIG. 6 is a block diagram showing a structure of a high potential generating circuit in the prior art.

FIG. 6 is a block diagram showing a structure of such a high-potential generating circuit. In FIG. 6, the high-potential generating circuit is provided with a charge pumping circuit 71 and a potential detecting circuit 72.

Charge pumping circuit 71 is controlled by a control signal VO', and supplies a predetermined amount of positive charges onto a line carrying high potential VPP in synchronization with clock signal CLK. Potential detecting circuit 72 detects whether the potential on the line of high potential VPP is higher than a target potential VPPR or not, and thereby applies a signal VO' at the level corresponding to the result of detection to charge pumping circuit 71.

When the potential on the line of high potential VPP is lower than target potential VPPR, control signal VO' attains the "L" and thus active level so that charge pumping circuit 71 is activated to supply positive charges onto the line of high potential VPP. When the potential on the line of high potential VPP is higher than target potential VPPR, control signal VO' attains the "H" and thus inactive level so that charge pumping circuit 71 is deactivated to stop supply of the positive charges onto the line of high potential VPP. Accordingly, target potential VPPR is kept on the line of high potential VPP.

Figure 7:
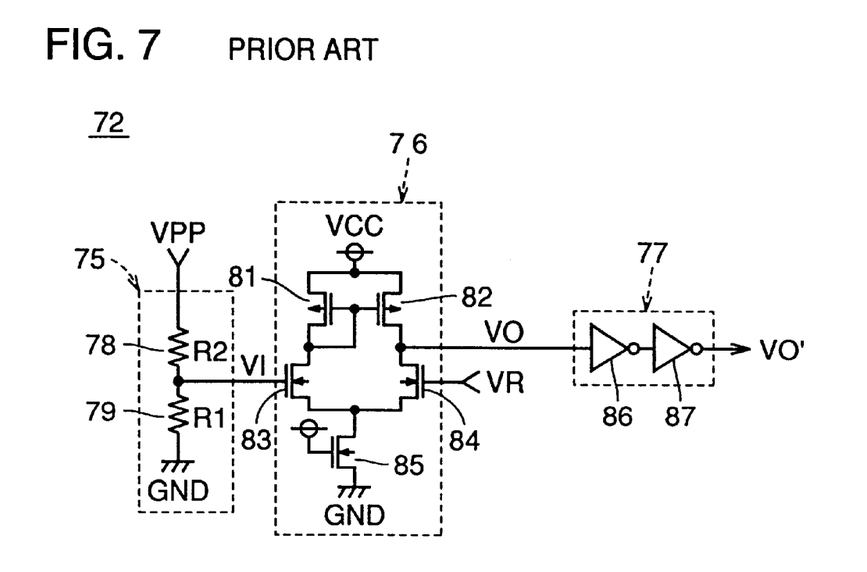
FIG. 7 is a circuit diagram showing a structure of a potential detecting circuit shown in FIG. 6.

FIG. 7 is a circuit diagram showing a structure of potential detecting circuit 72 shown in FIG. 6. Referring to FIG. 7, potential detecting circuit 72 includes a voltage dividing circuit 75, a differential amplifier 76 and a buffer circuit 77. Voltage dividing circuit 75 includes resistance elements 78 and 79 which are connected in series between the line of high potential VPP and the line of ground potential GND. Resistance elements 78 and 79 have predetermined resistance values R2 and R1, respectively. Voltage dividing circuit 75 issues an output potential VI equal to (VPP×R1/(R1+R2)) to differential amplifier 76.

Differential amplifier 76 includes P-channel MOS transistors 81 and 82 as well as N-channel MOS transistors 83–85, and determines whether output potential VI of voltage dividing circuit 75 is higher than a reference potential VR or not. Thereby, differential amplifier 76 issues signal VO at the level corresponding to the result of this determination. Signal VO is at "L" and therefore active level when output potential VI of voltage dividing circuit 75 is lower than reference potential VR, and is at "H" and therefore inactive level when output potential VI of voltage dividing circuit 75 is higher than reference potential VR.

In other words, when potential VPP is lower than target potential VPPR=VR×(R1+R2)/R1, signal VO is at "L" and therefore active level. When potential VPP is higher than target potential VPPR, signal VO is at "H" and therefore inactive level. Signal VO is applied to buffer circuit 77 formed of inverters 86 and 87 which are connected in series and are arranged in even stages (two stages in the figure). Output signal VO' of buffer circuit 77 is applied to charge pumping circuit 71 in FIG. 6. Therefore, the line of high potential VPP is kept at the level of target potential VPPR=VR×(R1+R2)/R1.

In potential detecting circuit 72, however, high potential VPP may stay near target potential VPPR. In this case, output potential VI of voltage dividing circuit 75 stays near reference potential VR so that differential amplifier 76 carries substantially equal potentials on its two inputs, and output signal VO stays near an intermediate level VCC/2. Thereby, a through current flows in inverters 86 and 87, resulting in increase in current consumption.

Figure 8:
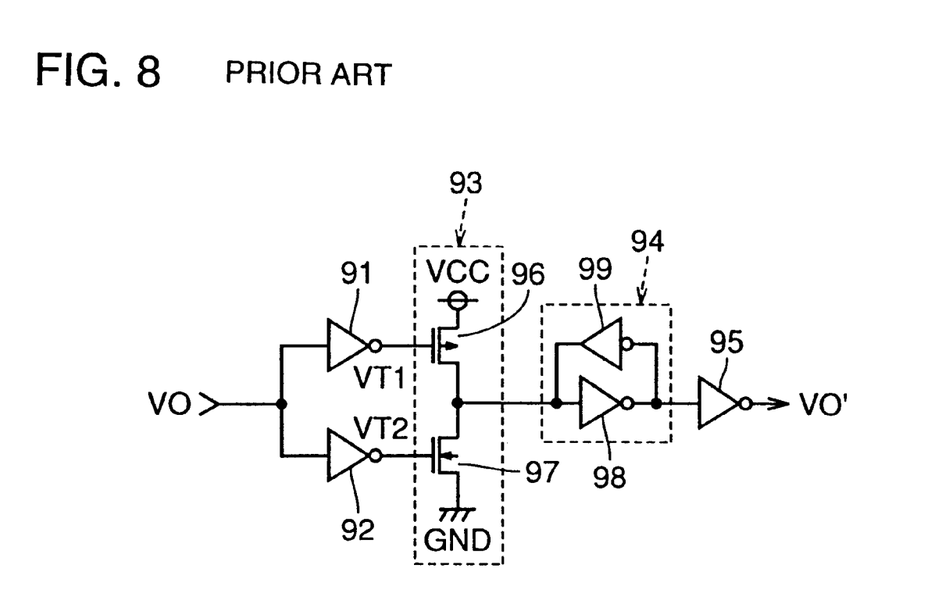
FIG. 8 is a circuit diagram showing a structure of a buffer circuit in the prior art.

Accordingly, a buffer circuit which can suppress increase in current consumption due to the through current has been proposed (see Japanese Patent Laying-Open No. 5-335898). FIG. 8 is a circuit diagram showing a structure of such a buffer circuit.

In FIG. 8, the buffer circuit includes inverters 91–93 and 95, and a latch circuit 94. Inverter 93 includes a P-channel MOS transistor 96 and an N-channel MOS transistor 97 which are connected in series between a line carrying power supply potential VCC and a line carrying ground potential GND. Input signal VO is supplied to a gate of P-channel MOS transistor 96 via an inverter 91, and is also supplied to a gate of N-channel MOS transistor 97 via an inverter 92. Inverter 92 has a threshold potential VT2 lower than a threshold potential VT1 of inverter 91.

Latch circuit 94 includes inverters 98 and 99 which are connected in an inverse-parallel manner, and latches the output signal of inverter 93. The output signal of latch circuit 94 is inverted to form signal VO' by inverter 95.

In the buffer circuit, threshold potential VT2 of inverter 92 is lower than threshold potential VT1 of inverter 91 so that MOS transistors 96 and 97 of inverter 93 are not turned on simultaneously. Accordingly, a through current does not flow in inverter 93 even when input signal VO stays near the intermediate level VCC/2.

Even in such a case that input signal V4 is at a level between VT2 and VT1, and both MOS transistors 96 and 97 of inverter 93 are turned off, latch circuit 94 holds the output node of inverter 93 and the input node of inverter 95 at "H" or "L" level. Therefore, a through current does not flow in inverters 95, 98 and 99.

In the above buffer circuit, however, a through current flows in inverters 91 and 92 in the initial stage, and therefore the current consumption increases when input signal VO stays near intermediate level VCC/2.

Figure 9:
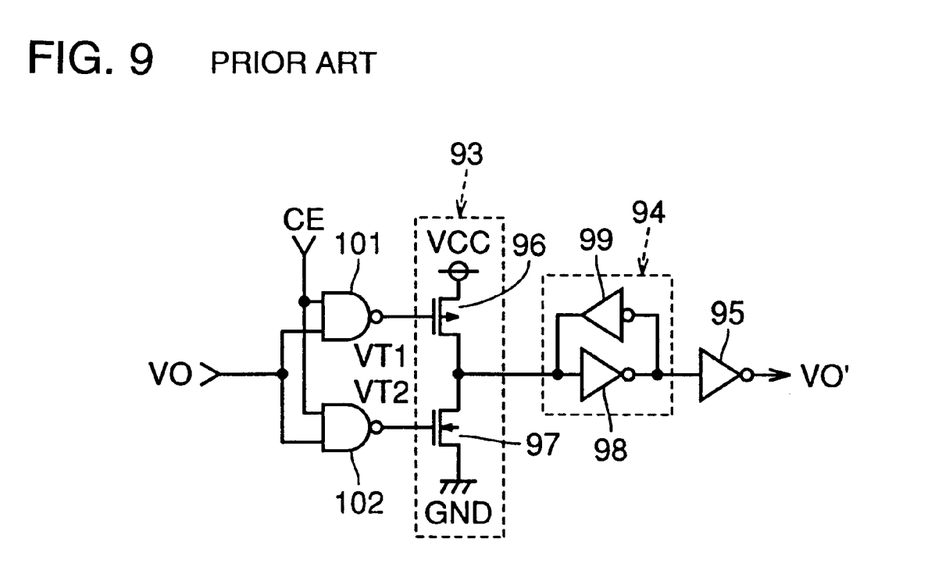
FIG. 9 is a circuit diagram showing a structure of another buffer circuit in the prior art.

A buffer circuit in FIG. 9 is a modification of the buffer circuit in FIG. 8, and employs NAND gates 101 and 102 in place of inverters 91 and 92. Input signal VO is applied to one of input nodes of each of NAND gates 101 and 102. A chip enable signal CE is applied to the other input node of each of NAND gates 101 and 102.

When signal CE is at "L" level and the chip is inactive, the outputs of NAND gates 101 and 102 are fixed to "H" level, and a through current does not flow in the buffer circuit. When signal CE is at "H" level and the chip is active, NAND gates 101 and 102 operate as inverters with respect to input signal VO. In this case, the buffer circuit in FIG. 9 performs the same operation as the buffer circuit in FIG. 8.

In this buffer circuit, therefore, the through current does not flow when the chip is inactive, but the through current flows in NAND gates 101 and 102 when input signal VO stays near the intermediate level VCC/2 during the active state of chip.

SUMMARY OF THE INVENTION

Accordingly, a major object of the invention is to provide a buffer circuit operating with a small current consumption as well as a potential detecting circuit using such a buffer circuit.

A buffer circuit according to the invention includes first and second inverter circuits each issuing an inverted signal of an input signal, a current restricting element connected in series with an electric element forming the first or the second inverter circuit at least between an output node of the first inverter circuit and a line carrying a first power supply potential or between an output node of the second inverter circuit and a line carrying a second power supply potential, first and second transistors having first and second conductivity types, and receiving on their input electrodes the output signals of the second and first inverter circuits, respectively, and a latch circuit latching a signal appearing on a node between the first and second transistors. Accordingly, even when the input signal stays near an intermediate level, the current restricting element suppresses a through current in at least one of the first and second inverter circuits, and therefore the current consumption can be reduced.

Preferably, the current restricting element is connected at least between a first power supply node of said first inverter circuit and a line carrying said first power supply potential or between a second power supply node of said second inverter circuit and a line carrying said second power supply potential.

Preferably, each of the first and second inverter circuits includes a third transistor of the first conductivity type and a fourth transistor of the second conductivity type connected between an output node and the first and second power supply nodes, respectively. The input signal is applied to input electrodes of the third and fourth transistors. This allows easy formation of the first and second inverter circuits.

A potential detecting circuit according to an aspect of the invention includes a differential amplifier comparing an input potential with a target potential, and issuing a signal at a level corresponding to the result of comparison, first and second inverter circuits each issuing an inverted signal of the output signal of the differential amplifier, a current restricting element connected in series with an electric element forming the first or the second inverter circuit at least between an output node of the first inverter circuit and a line carrying a first power supply potential or between an output node of the second inverter circuit and a line carrying a second power supply potential, first and second transistors having first and second conductivity types, and receiving on their input electrodes the output signals of the second and first inverter circuits, respectively, and a latch circuit latching a signal appearing on a node between the first and second transistors. Accordingly, even when the output signal of the differential amplifier stays near an intermediate level, the current restricting element suppresses a through current in at least one of the first and second inverter circuits, and therefore the current consumption can be reduced.

Preferably, the current restricting element is connected at least between a first power supply node of said first inverter circuit and a line carrying said first power supply potential or between a second power supply node of said second inverter circuit and a line carrying said second power supply potential.

Preferably, each of the first and second inverter circuits includes a third transistor of the first conductivity type and a fourth transistor of the second conductivity type connected between an output node and the first and second power supply nodes, respectively. The output signal of the differential amplifier is applied to input electrodes of the third and fourth transistors. This allows easy formation of the first and second inverter circuits.

Preferably, the potential detecting circuit further includes a potential generating circuit generating a variable output potential for producing the target potential. This allows easy change in detection level of the input potential.

According to another aspect of the invention, a potential detecting circuit includes a voltage dividing circuit producing a divided potential of an input potential, a differential amplifier comparing the divided potential with a reference potential associated with a target potential, and issuing a signal at a level corresponding to the result of comparison, first and second inverter circuits each issuing an inverted signal of the output signal of the differential amplifier, a current restricting element connected in series with an electric element forming the first or the second inverter circuit at least between an output node of the first inverter circuit and a line carrying a first power supply potential or between an output of the second inverter circuit and a line carrying a second power supply potential, first and second transistors having first and second conductivity types, and receiving on their input electrodes the output signals of the second and first inverter circuits, respectively, and a latch circuit latching a signal appealing on a node between the first and second transistors. Accordingly, even when the output signal of the differential amplifier stays near an intermediate level, the current restricting element suppresses a through current in at least one of the first and second inverter circuits, and therefore the current consumption can be reduced.

Preferably, the dividing ratio of the voltage dividing circuit is variable. This allows each change in detection level of the input potential.

Preferably, the current restricting element is connected at least between a first power supply node of said first inverter circuit and a line carrying said first power supply potential or between a second power supply node of said second inverter circuit and a line carrying said second power supply potential.

Preferably, each of the first and second inverter circuits includes a third transistor of the first conductivity type and a fourth transistor of the second conductivity type connected between an output node and the first and second power supply nodes, respectively. The output signal of the differential amplifier is applied to input electrodes of the third and fourth transistors. This allows easy formation of the first and second inverter circuits.

Preferably, the potential detecting circuit further includes a potential generating circuit generating a variable output potential for producing the reference potential. This allows easy change in detection level of the input potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
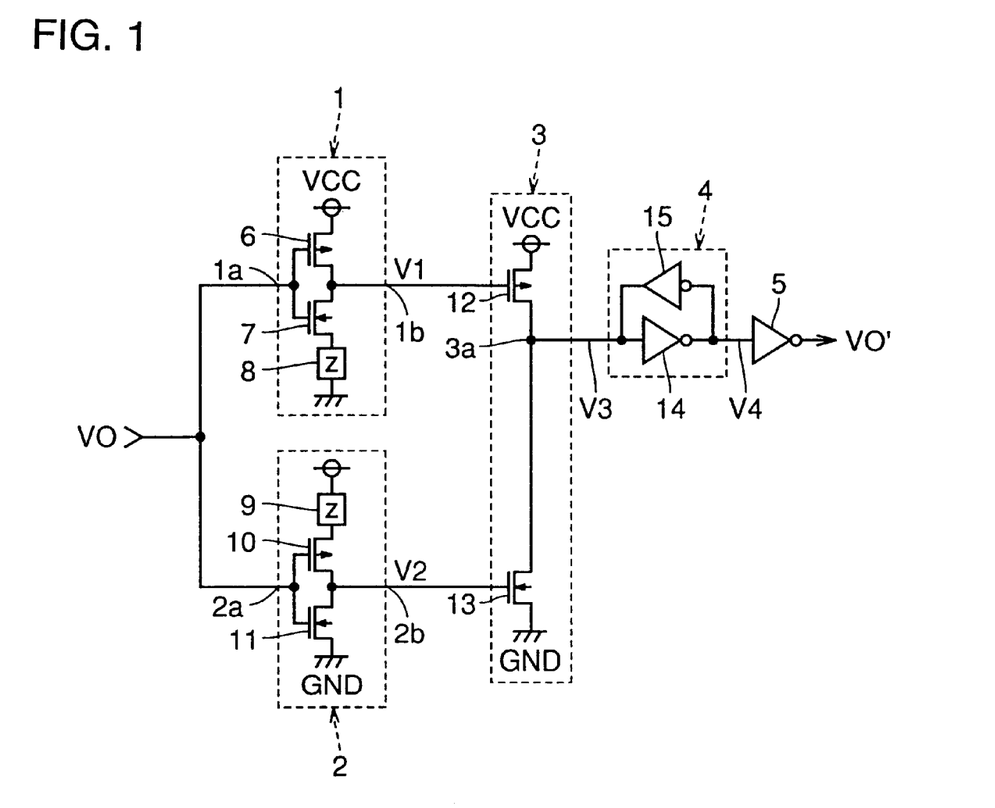
FIG. 1 is a circuit diagram showing a structure of a buffer circuit according to a first embodiment of the invention.
Figure 2A:
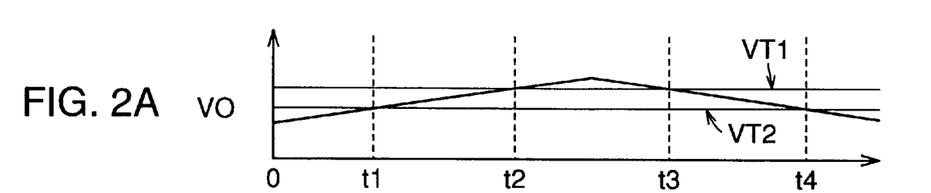
FIGS. 2A–2D are time charts showing operations of the buffer circuit shown in FIG. 1.
Figure 2B:
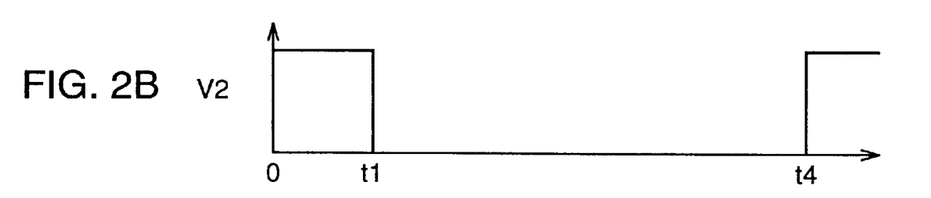
Figure 2C:
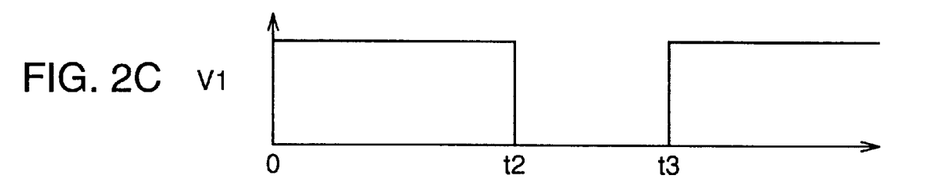
Figure 2D:
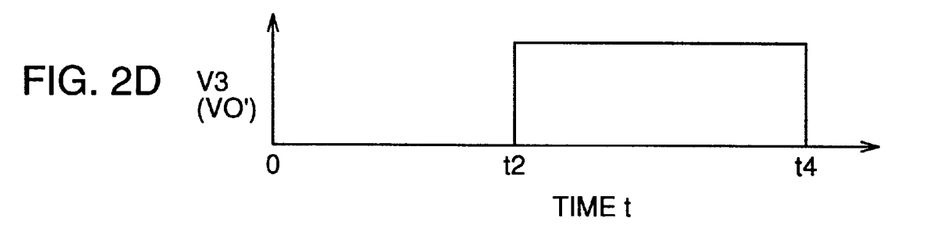

FIG. 1 is a circuit diagram showing a structure of a buffer circuit according to a first embodiment of the invention. Referring to FIG. 1, the buffer circuit includes inverters 1–3 and 5, and a latch circuit 4.

Inverter 1 includes a P-channel MOS transistor 6, an N-channel MOS transistor 7 and a current restricting element 8, which are connected in series between a line carrying a power supply potential VCC and a line carrying a ground potential GND. Gates of MOS transistors 6 and 7 are connected together to form an input node 1a of inverter 1. Drains of MOS transistors 6 and 7 form an output node 1b of inverter 1. Input node 1a of inverter 1 receives an input signal VO. Current restricting element 8 is formed of, e.g., a high resistance element or an MOS transistor which has a narrower channel width and a longer channel length than MOS transistor 7.

In inverter 1, current restricting element 8 is connected in series to MOS transistors 6 and 7. Therefore, a through current flowing in inverter 1 is restricted to a current which is allowed by current restricting element 8 even when input signal VO stays near an intermediate level VCC/2. Accordingly, a large through current does not flow. Since current restricting element 8 is connected between the source of N-channel MOS transistor 7 and the line of ground potential GND, a threshold potential VT1 of inverter 1 is higher than the threshold potential of a conventional inverter which is formed of only P- and N-channel MOS transistors. An output potential V1 of inverter 1 falls from "H" level to "L" level in response to the fact that the level of input signal VO exceeds threshold potential VT1.

Inverter 2 includes a current restricting element 9, and P- and N-channel MOS transistors 10 and 11 which are connected in series between the line of power supply potential VCC of the line of ground potential GND. Gates of MOS transistors 10 and 11 are connected together to form an input node 2a of inverter 2. Drains of MOS transistors 10 and 11 form an output node 2b of inverter 2. Input node 2a of inverter 2 receives input signal VO. Similarly to current restricting element 8, current restricting element 9 is formed of, e.g., a high resistance element or an MOS transistor which has a narrower channel width and a longer channel length than MOS transistor 10.

In inverter 2, current restricting element 9 is connected in series to MOS transistors 10 and 11. Therefore, a through current flowing in inverter 2 is restricted to a current which is allowed by current restricting element 9 even when input signal VO stays near intermediate level VCC/2. Accordingly, a large through current does not flow. Since current restricting element 9 is connected between the source of P-channel MOS transistor 10 and the line of power supply potential VCC, threshold potential VT2 of inverter 2 is lower than that of a conventional inverter which is formed of only P- and N-channel MOS transistors. An output potential V2 of inverter 2 falls from "H" level to "L" level in response to the fact that the level of input signal VO exceeds threshold potential VT2.

Inverter 3 includes P- and N-channel MOS transistors 12 and 13 which are connected in series between the line of power supply potential VCC and the line of ground potential GND. A gate of P-channel MOS transistor 12 receives output signal V1 of inverter 1, and a gate of N-channel MOS transistor 13 receives output signal V2 of inverter 2. Drains of MOS transistors 12 and 13 form an output node 3a of inverter 3.

When both output signals V1 and V2 of inverters 1 and 2 are at "H" level, P-channel MOS transistor 12 is off, and N-channel MOS transistor 13 is on so that output signal V3 of inverter 3 attains "L" level. When output signals V1 and V2 of inverters 1 and 2 are at "H" and "L" levels, respectively, both MOS transistors 12 and 13 are off so that output signal V3 of inverter 3 does not change. When both output signals V1 and V2 of inverters 1 and 2 are at "L" level, P-channel MOS transistor 12 is on, and N-channel MOS transistor 13 is off so that output signal V3 of inverter 3 is at "H" level. Since threshold potential VT1 of inverter 1 is higher than threshold potential VT2 of inverter 2, output signals V1 and V2 of inverters 1 and 2 do not attain "L" and "H" levels, respectively.

Latch circuit 4 includes an inverter 14 receiving output signal V3 of inverter 3, and an inverter 15 which is connected to inverter 14 in an inverse-parallel manner. Even when MOS transistors 12 and 13 of inverter 3 are turned off, latch circuit 4 latches output signal V3 of inverter 3 which was issued immediately before MOS transistors 12 and 13 are turned off. An output signal V4 of latch circuit 4 is inverted by inverter 5, and thereby forms output signal VO' of the buffer circuit.

FIGS. 2A–2D are time charts showing operations of the buffer circuit shown in FIG. 1. Referring to FIGS. 2A–2D, it is assumed that the level of input signal VO monotonously rises, and then monotonously lowers. During a period from time 0 to time t1, input signal VO is at a level lower than threshold potentials VT1 and VT2 of inverters 1 and 2 so that both output signals V1 and V2 of inverters 1 and 2 are at "H" level. Thereby, P-channel MOS transistor 12 of inverter 3 is turned off, and N-channel MOS transistor 13 is turned on so that output signal V3 of inverter 3 attains "L" level, and output signal VO' of the buffer circuit also attains "L" level.

During a period between times t1 and t2, a relationship of VT2<VO<VT1 is established. Therefore, output signals V1 and V2 of inverters 1 and 2 are at "H" and "L" levels, respectively, and both MOS transistors 12 and 13 of inverter 3 are off. Latch circuit 4 latches the level ("L" level) of signal V3 which was supplied during the period between times 0 and t1. During this period between times t1 and t2, therefore, the output signal VO' of the buffer circuit does not change from "L" level.

During a period between times t2 and t3, a relationship of VT2<VT1<VO is established so that both output signals V1 and V2 of inverters 1 and 2 are at "L" level. Thereby, P-channel MOS transistor 12 of inverter 3 is turned on, and N-channel MOS transistor 13 is turned off so that output signal V3 of inverter 3 is at "H" level, and output signal VO' of the buffer circuit is also at "H" level.

During a period between times t3 and t4, a relationship of VT2<VO<VT1 is established so that output signals V1 and V2 of inverters 1 and 2 are at "H" and "L" levels, respectively, and both MOS transistors 12 and 13 of inverter 3 are off. Latch circuit 4 latches the level ("H" level) of signal V3 which was applied during the period between times t2 and t3. In this period between times t3 and t4, therefore, output signal VO' of the buffer circuit does not change from "H" level.

After time t4, a relationship of VO<VT2<VT1 is established so that both output signals V1 and V2 of inverters 1 and 2 are at "H" level. Thereby, P-channel MOS transistor 12 of inverter 3 is off, and N-channel MOS transistor 13 is on so that output signal V3 of inverter 3 is at "L" level, and output signal VO' of the buffer circuit is also at "L" level.

In this embodiment, current restricting element 8 is connected between the source of N-channel MOS transistor 7 of inverter 1 in the initial stage and the line of ground potential GND, and current restricting element 9 is connected between the source of P-channel MOS transistor 10 of inverter 2 in the initial stage and the line of power supply potential VCC. Therefore, a through current flowing in each of inverters 1 and 2 is suppressed even when input signal VO stays near intermediate level VCC/2, and therefore the current consumption can be reduced.

In the first embodiment, each of inverters 1 and 2 is provided with the current restricting element. However, only one of inverters 1 and 2 may be provided with the current restricting element. Even in this case, the through current can be smaller than that in the prior art.

In the first embodiment, a current restricting element 8 is connected between the source of N channel MOS transistor 7 and the line carrying the ground potential GND. Current restricting element 8, however, may be connected between the drain of N channel MOS transistor 7 and output node 1b. Though current restricting element 9 is connected between the source of P channel MOS transistor 10 and the line carrying the power supply potential VCC, it may be connected between the drain of P channel MOS transistor 10 and output node 2b. In this case also, same effects can be attained.

[Second Embodiment]

Figure 3:
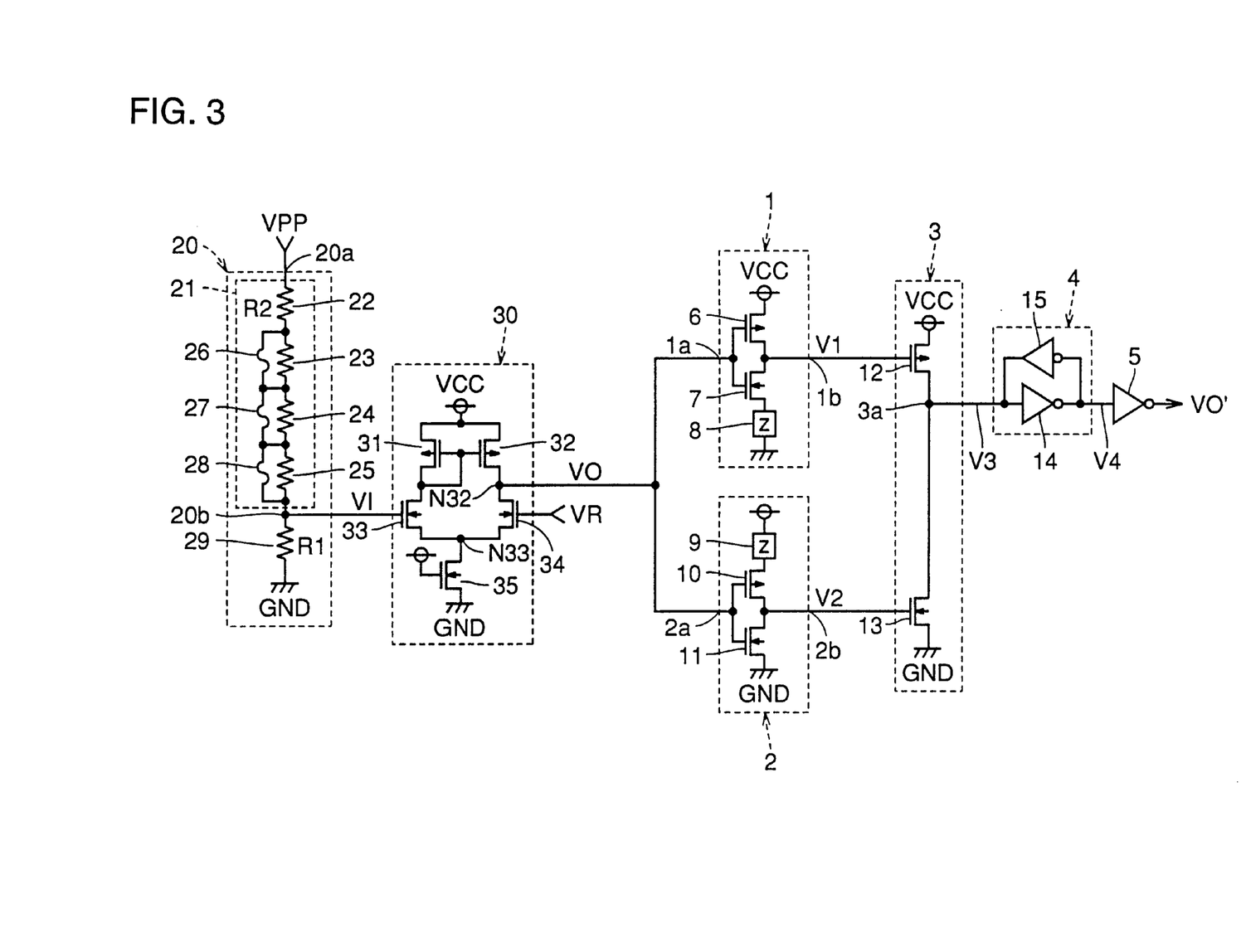
FIG. 3 is a circuit diagram showing a structure of a potential detecting circuit according to a second embodiment of the invention.

FIG. 3 is a circuit diagram showing a structure of a potential detecting circuit according to a second embodiment of the invention. Referring to FIG. 3, the potential detecting circuit includes a voltage dividing circuit 20, a differential amplifier 30 and the buffer circuit shown in FIG. 1. The potential detecting circuit is used as potential detecting circuit 72 for detecting high potential VPP (>VCC) issued from charge pumping circuit 71 shown in FIG. 6.

Voltage dividing circuit 20 includes a variable resistance circuit 21 and a resistance element 29. Variable resistance element 21 includes a plurality of (four in the figure) resistance elements 22–25 connected in series between input and output nodes 20a and 20b, and fuses 26–28 connected in parallel with resistance elements 23–25, respectively. Resistance element 29 has a predetermined resistance value R1, and is connected between output node 20b and the line of ground potential GND. Input node 20a is supplied with output potential VPP of charge pumping circuit 71. A resistance value R2 of variable resistance circuit 21 can be changed by appropriately blowing fuses 26–28. Output potential VI of voltage dividing circuit 20 is equal to (VPP×R1/(R1+R2)).

Differential amplifier 30 includes P-channel MOS transistors 31 and 32 as well as N-channel MOS transistors 33–35. MOS transistors 31 and 33 in series as well as MOS transistors 32 and 34 in series are connected between the line of power supply potential VCC and a node N33. Both the gates of P-channel MOS transistors 31 and 32 are connected to the drain of P-channel MOS transistor 31. P-channel MOS transistors 31 and 32 form a current mirror circuit. N-channel MOS transistor 33 receives output potential VI of voltage dividing circuit 20 on its gate, and N-channel MOS transistor 34 receives reference potential VR on its gate. The drain of N-channel MOS transistor 34 form an output node N32 of differential amplifier 30. N-channel MOS transistor 35 is connected between node N33 and the line of ground potential GND, and receives power supply potential VCC on its gate.

When output potential VI of voltage dividing circuit 20 is higher than reference potential VR, a current flowing through MOS transistors 31 and 33 is larger than that flowing through MOS transistors 32 and 34, and output signal VO of differential amplifier 30 attains "H" level. When output potential VI of voltage dividing circuit 20 is lower than reference potential VR, the current flowing through MOS transistors 31–33 is smaller than the current which is allowed to flow by MOS transistor 34, and output signal VO of differential amplifier 30 is at "L" level.

In other words, when VPP is higher than target potential of VR×(R1+R2)/R1, output signal VO of differential amplifier 30 is at "H" level. When VPP is lower than VR×(R1+R2)/R1, output signal VO of differential amplifier 30 is at "L" level. Accordingly, the detection level of this potential detecting circuit can be set to an intended value by changing resistance value R2 of variable resistance circuit 21.

Output signal VO of differential amplifier 30 is applied to inverters 1 and 2 of the buffer circuit. Therefore, through currents in inverters 1 and 2 are suppressed by current restricting elements 8 and 9 even when VPP stays near VR×(R1+R2)/R1, output potential VI of voltage dividing circuit 20 stays near VR and output signal VO of differential amplifier 30 stays near intermediate level VCC/2. The structure and operation of the buffer circuit are the same as those in the first embodiment, and therefore will not be described.

[Third Embodiment]

Figure 4:
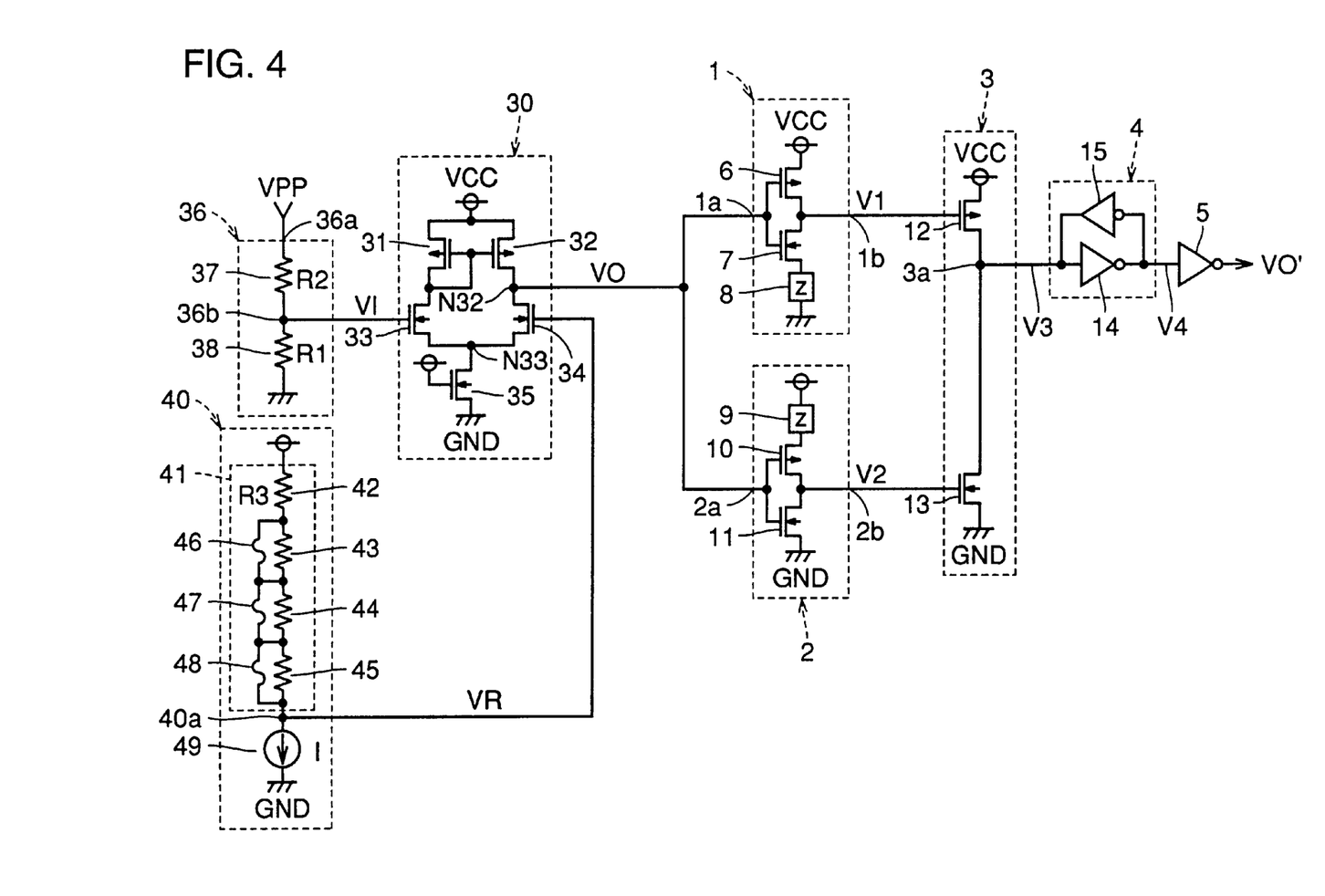
FIG. 4 is a circuit diagram showing a structure of a potential detecting circuit according to a third embodiment of the invention.

FIG. 4 is a circuit diagram showing a structure of a potential detecting circuit according to a third embodiment of the invention. Referring to FIG. 4, the potential detecting circuit includes a voltage dividing circuit 36, a reference potential generating circuit 40 and differential amplifier 30 as well as the buffer circuit shown in FIG. 1. The potential detecting circuit in FIG. 4 is used as potential detecting circuit 72 for detecting high potential VPP (>VCC) issued from charge pumping circuit 71 in FIG. 6.

Voltage dividing circuit 36 includes a resistance element 37 connected between input and output nodes 36a and 36b, and a resistance element 38 connected between output node 36b and the line of ground potential GND. Resistance elements 37 and 38 have resistance values R2 and R1, respectively. Input node 36a is supplied with output potential VPP of charge pumping circuit 71. Output potential VI of voltage dividing circuit 36 becomes equal to VPP×R1/(R1+R2), and is applied to the gate of N-channel MOS transistor 33 of differential amplifier 30.

Reference potential generating circuit 40 includes a variable resistance circuit 41 and a constant current source 49. Variable resistance circuit 41 includes a plurality of (four in the figure) resistance elements 42–45 which are connected in series between the line of power supply potential VCC and output node 40a as well as fuses 46–48 which are connected in parallel with resistance elements 43–45, respectively. A resistance value R3 of variable resistance circuit 41 can be changed by appropriately blowing fuses 46–48. Constant current source 49 is connected between output node 40a and the line of ground potential GND, and supplies a constant current I. Output potential VR of reference potential generating circuit 40 is equal to VCC−I×R3, and is applied to the gate of N-channel MOS transistor 34 of differential amplifier 30.

Differential amplifier 30 compares output potential VI of voltage dividing circuit 36 with output potential VR of reference potential generating circuit 40, and issues signal VO at the level corresponding to the result of this comparison. When output potential VI of voltage dividing circuit 36 is higher than output potential VR of reference potential generating circuit 40, output signal VO of differential amplifier 30 is at "H" level. When output potential VI of voltage dividing circuit 36 is lower than output potential VR of reference potential generating circuit 40, output signal VO of differential amplifier 30 is at "L" level.

In other words, when VPP is higher than target potential of VR×(R1+R2)/R1=(VCC−I×R3)×(R1+R2)/R1, signal VO is at "H" level. Otherwise, signal VO is at "L" level. Accordingly, the detection level of this potential detecting circuit can be set to an intended value by changing resistance value R3 of variable resistance circuit 41.

Output signal VO of differential amplifier 30 is applied to inverters 1 and 2 of the buffer circuit. Accordingly, the through currents in inverters 1 and 2 are suppressed even when VPP stays near (VCC−I×R3)×(R1+R2)/R1, output potential VI of voltage dividing circuit 36 stays near VR=VCC−I×R3, and output signal VO of differential amplifier 30 stays near intermediate level VCC/2. The structure and operation of the buffer circuit are the same as those in the first embodiment, and therefore will not be described.

[Modification]

Figure 5:
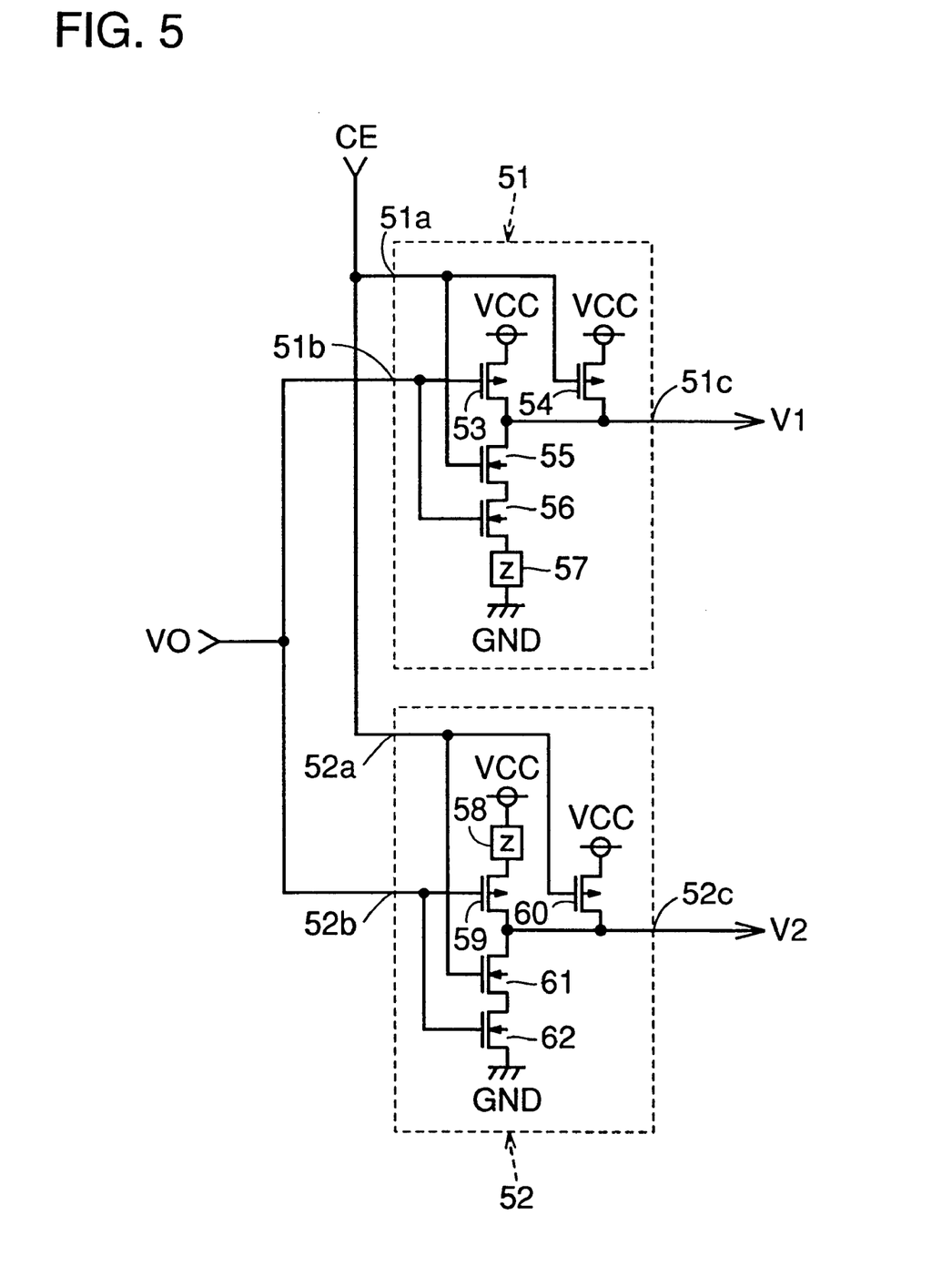
FIG. 5 is a circuit diagram showing a modification of the first to third embodiments.

FIG. 5 is a circuit diagram showing a modification of the first to third embodiments. In this modification, NAND gates 51 and 52 are employed in place of inverters 1 and 2 in the first to third embodiments, respectively.

NAND gate 51 includes P-channel MOS transistors 53 and 54 connected in parallel between the line of power supply potential VCC and an output node 51c, and also includes N-channel MOS transistors 55 and 56 as well as a current restricting element 57 which are connected in series between output node 51c and the line of ground potential GND. Gates of MOS transistors 54 and 55 are connected together to form a first input node 51a. Gates of MOS transistors 53 and 56 are connected together to form a second input node 51b. First input node 51a is supplied with chip enable signal CE, and second input node 51b is supplied with signal VO. Current restricting element 57 is formed of, e.g., a high resistance element or an MOS transistor which has a narrower channel width and a longer channel length than MOS transistor 56.

When signal CE is at "L" level and the chip is inactive, P-channel MOS transistor 54 is on and N-channel MOS transistor 55 is off so that output signal V1 of NAND gate 51 is fixed at "H" level independently of the level of input signal VO. Accordingly, no through current flows in NAND gate 51 and inverter 3.

When signal CE is at "H" level and the chip is active, N-channel MOS transistor 55 is on, and P-channel MOS transistor 54 is off so that NAND gate 51 operates as an inverter with respect to input signal VO. In this case, current restricting element 57 is connected in series to MOS transistors 53, 55 and 56. Therefore, the through current flowing in NAND gate 51 is restricted to the current which is allowed by current restricting element 57 even when input signal VO stays near the intermediate level VCC/2, and therefore a large through current does not flow.

Current restricting element 57 is connected between the source of N-channel MOS transistor 56 and the line of ground potential GND. Therefore, a threshold potential VT51 of NAND gate 51 with respect to input signal VO is higher than a threshold potential of a conventional NAND gate formed of only P- and N-channel MOS transistors. Output potential V1 of NAND gate 51 falls from "H" level to "L" level in response to the fact that the level of input signal VO exceeds threshold potential VT51.

NAND gate 52 includes a current restricting element 58 and a P-channel MOS transistor 59 which are connected in series between the line of power supply potential VCC and an output node 52c, and also includes a P-channel MOS transistor 60 connected between the line of power supply potential VCC and the output node 52c, and N-channel MOS transistors 61 and 62 which are connected in series between output node 52c and the line of ground potential GND. Gates of MOS transistors 60 and 61 are connected together to form a first input node 52a. Gates of MOS transistors 59 and 62 are connected together to form a second input node 52b. First input node 52a is supplied with chip enable signal CE, and second input node 52b is supplied with signal VO. Current restricting element 58 is formed of, e.g., a high resistance element or an MOS transistor which has a narrower channel width and a longer channel length than MOS transistor 59.

When signal CE is at "L" level and the chip is inactive, P-channel MOS transistor 60 is on and N-channel MOS transistor 61 is off so that output potential V2 of NAND gate 52 is fixed to "H" level independently of the level of input signal VO. Accordingly, no through current flows in NAND gate 52.

When signal CE is at "H" level and the chip is active, N-channel MOS transistor 61 is on and P-channel MOS transistor 60 is off so that NAND gate 52 operates as an inverter with respect to input signal VO. In this case, current restricting element 58 is connected in series to MOS transistors 59, 61 and 62. Therefore, the through current flowing in NAND gate 52 is restricted to the current which is allowed by current restricting element 58 even when input signal VO stays near intermediate level VCC/2, and therefore a large through current does not flow.

Since current restricting element 58 is connected between the source of P-channel MOS transistor 59 and the line of power supply potential VCC, threshold potential VT2 of NAND gate 52 with respect to input signal VO is lower than a threshold potential of a conventional NAND gate formed of only P- and N-channel MOS transistors. Output potential V2 of NAND gate 52 falls from "H" level to "L" level in response to the fact that the level of input signal VO exceeds threshold potential VT52. Structures and operations other than the above are the same as those of the first to third embodiments, and therefore will not be described.

In this modification, each of NAND gates 51 and 52 is provided with the current restricting element. However, only one of NAND gates 51 and 52 may be provided with the current restricting element. In this case, the effect of reducing the through current can likewise be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A buffer circuit for transmitting an input signal to a circuit in a subsequent stage, comprising:

first and second inverter circuits driven by first and second power supply potentials applied via first and second power supply nodes, respectively, and each issuing an inverted signal of said input signal through an output node;

a current restricting element connected in series with an electric element forming the first or the second inverter circuit at least between the output node of said first inverter circuit and a line carrying said first power supply potential or between the output node of said second inverter circuit and a line carrying said second power supply potential;

first and second transistors having first and second conductivity types, respectively, connected in series between the lines of said first and second power supply potentials, and receiving on their input electrodes the output signals of said second and first inverter circuits, respectively; and a latch circuit latching a signal appearing on a node between said first and second transistors, and applying the latched signal to said circuit in the subsequent stage, wherein said current restricting element has smaller current capacity than said electric element.

2. The buffer circuit according to claim 1, wherein said current restricting element is connected at least between the first power supply node of said first inverter circuit and the line carrying said first power supply potential or between the second power supply node of said second inverter circuit and the line carrying said second power supply potential.

3. The buffer circuit according to claim 2, wherein each of said first and second inverter circuits includes a third transistor of the first conductivity type and a fourth transistor of the second conductivity type connected between said output node and said first and second power supply nodes, respectively, and said input signal is applied to input electrodes of said third and fourth transistors.

4. A potential detecting circuit for determining whether an input potential reaches a target potential or not, and transmitting a signal corresponding to the result of determination to a circuit in a subsequent stage, comprising:

a differential amplifier comparing said input potential with said target potential, and issuing an output signal at a level corresponding to the result of comparison; and a buffer circuit for transmitting the output signal of said differential amplifier to said circuit in the subsequent stage, said buffer circuit including:

first and second inverter circuits driven by first and second power supply potentials applied via first and second power supply nodes, respectively, and each issuing an inverted signal of said output signal of the differential amplifier through an output node, a current restricting element connected in series with an electric element forming the first or the second inverter circuit at least between the output node of said first inverter circuit and a line carrying said first power supply potential or between the output node of said second inverter circuit and a line carrying said second power supply potential, first and second transistors having first and second conductivity types, respectively, connected in series between the lines of said first and second power supply potentials, and receiving on their input electrodes the output signals of said second and first inverter circuits, respectively, and a latch circuit latching a signal appearing on a node between said first and second transistors, and applying the latched signal to said circuit in the subsequent stage, wherein said current restricting element has smaller current capacity than said electric element.

5. The buffer circuit according to claim 4, wherein said current restricting element is connected at least between the first power supply node of said first inverter circuit and the line carrying said first power supply potential or between the second power supply node of said second inverter circuit and the line carrying said second power supply potential.

6. The potential detecting circuit according to claim 5, wherein each of said first and second inverter circuits includes a third transistor of the first conductivity type and a fourth transistor of the second conductivity type connected between said output node and said first and second power supply nodes, respectively, and said output signal of the differential amplifier is applied to input electrodes of said third and fourth transistors.

7. The potential detecting circuit according to claim 5, further comprising:

a potential generating circuit generating a variable output potential for producing said target potential.

8. A potential detecting circuit for determining whether an input potential reaches a target potential or not, and transmitting a signal corresponding to the result of determination to a circuit in a subsequent stage, comprising:

a voltage dividing circuit dividing said input potential for producing a divided potential;

a differential amplifier comparing the divided potential with a reference potential associated with the target potential, and issuing an output signal at a level corresponding to the result of comparison; and a buffer circuit for transmitting the output signal of said differential amplifier to said circuit in the subsequent stage, said buffer circuit including:

first and second inverter circuits driven by first and second power supply potentials applied via first and second power supply nodes, respectively, and each issuing an inverted signal of said output signal of said differential amplifier through an output node, a current restricting element connected in series with an electric element forming the first or the second inverter circuit at least between the output node of said first inverter circuit and a line carrying said first power supply potential or between the output node of said second inverter circuit and a line carrying said second power supply potential, first and second transistors having first and second conductivity types, respectively, connected in series between the lines of said first and second power supply potentials, and receiving on their input electrodes the output signals of said second and first inverter circuits, respectively, and a latch circuit latching a signal appearing on a node between said first and second transistors, and applying the latched signal to said circuit in the subsequent stage, wherein said current restricting element has smaller current capacity than said electric element.

9. The potential detecting circuit according to claim 8, wherein the dividing ratio of said voltage dividing circuit is variable.

10. The potential detecting circuit according to claim 8, wherein said current restricting element is connected at least between the first power supply node of said first inverter circuit and the line carrying said first power supply potential or between the second power supply node of said second inverter circuit and the line carrying said second power supply potential.

11. The potential detecting circuit according to claim 10, wherein each of said first and second inverter circuits includes a third transistor of the first conductivity type and a fourth transistor of the second conductivity type connected between said output node and said first and second power supply nodes, respectively, and said output signal of the differential amplifier is applied to input electrodes of said third and fourth transistors.

12. The potential detecting circuit according to claim 8, further comprising:

a potential generating circuit generating a variable output potential for producing said reference potential.

13. The buffer circuit according to claim 1, wherein said current restricting element is provided to restrict through current flowing in the first or the second inverter circuit between the line carrying said first power supply potential and the line carrying said second power supply potential.

14. The potential detecting circuit according to claim 4, wherein said current restricting element is provided to restrict through current flowing in the first or the second inverter circuit between the line carrying said first power supply potential and the line carrying said second power supply potential.

15. A potential detecting circuit for determining whether an input potential reaches a target potential or not, and transmitting a signal corresponding to the result of determination to a circuit in a subsequent stage, comprising:

a differential amplifier comparing said input potential with said target potential, and issuing an output signal at a level corresponding to the result of comparison;

a buffer circuit for transmitting the output signal of said differential amplifier to said circuit in the subsequent stage, and a potential generating circuit generating a variable output potential for producing said target potential;

said buffer circuit including:

first and second inverter circuits driven by first and second power supply potentials applied via first and second power supply nodes, respectively, and each issuing an inverted signal of said output signal of the differential amplifier through an output node, a current restricting element connected in series with an electric element forming the first or the second inverter circuit at least between the output node of said first inverter circuit and a line carrying said first power supply potential or between the output node of said second inverter circuit and a line carrying said second power supply potential, first and second transistors having first and second conductivity types, respectively, connected in series between the lines of said first and second power supply potentials, and receiving on their input electrodes the output signals of said second and first inverter circuits, respectively, and a latch circuit latching a signal appearing on a node between said first and second transistors, and applying the latched signal to said circuit in the subsequent stage, said current restricting element being connected at least between the first power supply node of said first inverter circuit and the line carrying said first power supply potential or between the second power supply node of said second inverter circuit and the line carrying said second power supply potential; and said potential generating circuit including:

a plurality of resistance elements connected in series between the line carrying said first power supply potential and an output node to provide said variable output potential, at least one fuse provided corresponding to at least one resistance element out of said plurality of resistance elements, and connected in parallel to a corresponding resistance element, and a constant current source connected between said output node of said potential generating circuit and the line carrying said second power supply potential.

16. The potential detecting circuit according to claim 8, wherein said current restricting element is provided to restrict through current flowing in the first or the second inverter circuit between the line carrying said first power supply potential and the line carrying said second power supply potential.

17. A potential detecting circuit for determining whether an input potential reaches a target potential or not, and transmitting a signal corresponding to the result of determination to a circuit in a subsequent stage, comprising:

a voltage dividing circuit dividing said input potential for producing a divided potential, and having variable dividing ratio;

a differential amplifier comparing the divided potential with a reference potential associated with the target potential, and issuing an output signal at a level corresponding to the result of comparison; and a buffer circuit for transmitting the output signal of said differential amplifier to said circuit in the subsequent stage, said buffer circuit including:

first and second inverter circuits driven by first and second power supply potentials applied via first and second power supply nodes, respectively, and each issuing an inverted signal of said output signal of said differential amplifier through an output node, a current restricting element connected in series with an electric element forming the first or the second inverter circuit at least between the output node of said first inverter circuit and a line carrying said first power supply potential or between the output node of said second inverter circuit and a line carrying said second power supply potential, first and second transistors having first and second conductivity types, respectively, connected in series between the lines of said first and second power supply potentials, and receiving on their input electrodes the output signals of said second and first inverter circuits, respectively, and a latch circuit latching a signal appearing on a node between said first and second transistors, and applying the latched signal to said circuit in the subsequent stage; and said voltage dividing circuit including:
  a plurality of first resistance elements connected in series between a node of said input potential and an output node to provide said divided potential,
  at least one fuse provided corresponding to at least one resistance element out of said plurality of resistance elements, and connected in parallel to a corresponding first resistance element, and
  a second resistance element connected between said output node of said voltage dividing circuit and said line of said second power supply potential.

18. A potential detecting circuit for determining whether an input potential reaches a target potential or not, and transmitting a signal corresponding to the result of determination to a circuit in a subsequent stage, comprising:

a voltage dividing circuit dividing said input potential for producing a divided potential;
  a differential amplifier comparing the divided potential with a reference potential associated with the target potential, and issuing an output signal at a level corresponding to the result of comparison;
  a buffer circuit for transmitting the output signal of said differential amplifier to said circuit in the subsequent stage, and
  a potential generating circuit generating a variable output potential for producing said reference potential;

said buffer circuit including:
  first and second inverter circuits driven by first and second power supply potentials applied via first and second power supply nodes, respectively, and each issuing an inverted signal of said output signal of said differential amplifier through an output node,
  a current restricting element connected in series with an electric element forming the first or the second inverter circuit at least between the output node of said first inverter circuit and a line carrying said first power supply potential or between the output node of said second inverter circuit and a line carrying said second power supply potential,
  first and second transistors having first and second conductivity types, respectively, connected in series between the lines of said first and second power supply potentials, and receiving on their input electrodes the output signals of said second and first inverter circuits, respectively, and
  a latch circuit latching a signal appearing on a node between said first and second transistors, and applying the latched signal to said circuit in the subsequent stage; and said potential generating circuit including:
  a plurality of resistance elements connected in series between the line carrying said first power supply potential and an output node to provide said variable output potential,
  at least one fuse provided corresponding to at least one resistance element out of said plurality of resistance elements and connected in parallel to a corresponding first resistance element, and
  a constant current source connected between said output node of said potential generating circuit and the line carrying said second power supply potential.

* * * * *